United States Patent
Chang

(10) Patent No.: US 7,603,602 B2
(45) Date of Patent: Oct. 13, 2009

(54) BUILT-IN SELF TEST CIRCUIT FOR ANALOG-TO-DIGITAL CONVERTER AND PHASE LOCK LOOP AND THE TESTING METHODS THEREOF

(75) Inventor: Yeong-Jar Chang, Taichung County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 563 days.

(21) Appl. No.: 11/563,253

(22) Filed: Nov. 27, 2006

(65) Prior Publication Data

US 2008/0125990 A1     May 29, 2008

(51) Int. Cl.
*G01R 31/28* (2006.01)
*H03M 1/10* (2006.01)
(52) U.S. Cl. ........................... 714/733; 341/120
(58) Field of Classification Search ................ 714/733; 341/120
See application file for complete search history.

(56) References Cited

U.S. PATENT DOCUMENTS

| | | | |
|---|---|---|---|
| 6,456,212 B1 * | 9/2002 | Kaplinsky | 341/120 |
| 6,492,798 B2 * | 12/2002 | Sunter | 324/76.15 |
| 7,154,421 B2 * | 12/2006 | Devendorf et al. | 341/118 |
| 7,208,983 B2 * | 4/2007 | Imaizumi et al. | 327/94 |
| 7,375,659 B2 * | 5/2008 | Huang | 341/61 |

* cited by examiner

*Primary Examiner*—James C Kerveros
(74) *Attorney, Agent, or Firm*—Winston Hsu

(57) ABSTRACT

A BIST circuit for testing both an analog-to-digital converter and a phase lock loop includes a controllable delay circuit, a NAND gate, a dividing circuit, a NOR gate and a charge/discharge circuit. The invention reduces the period of the signal under test, converts its pulse width to voltage and measures the output via an ADC. The clock jitter becomes sensitive through a delay cancellation method, thus, the accuracy is improved. The invention further comprises all testing procedure for period jitters of a PLL and static characteristics of an ADC. The test error caused by process variation can be corrected by a controllable delay circuit such that the error determination of the test result is prevented.

15 Claims, 9 Drawing Sheets

BUILT-IN SELF TEST CIRCUIT FOR ANALOG-TO-DIGITAL CONVERTER AND PHASE LOCK LOOP AND THE TESTING METHODS THEREOF

BACKGROUND OF THE INVENTION

1. Field of the Invention

The invention relates to a circuit, and more particularly to a built-in self test (BIST) circuit for testing not only the differential non-linearity(DNL) error and the integral non-linearity(INL) error of an analog-to-digital converter(ADC) but also the period jitters of a clock signal. The clock signal can be outputs of an oscillator or a phase lock loop.

2. Description of the Related Art

A phase lock loop (PLL) is widely used in frequency synthesization, clock correction, clock distribution and phase demodulation. Frequency synthesization, clock correction, clock distribution and phase demodulation are generally used in optical fiber links, radio phones and computers. Clock variations such as period jitters of the phase lock loop circuit may degrade performance and limit applications of the phase lock loop circuit. Thus, for high-speed applications, precise and cost effective measurement on clock variation and period jitter is required.

FIG. 1A is a block diagram showing a conventional BIST for measuring period jitters as disclosed in U.S. Pat. No. 6,937,106. A conventional BIST circuit uses time-to-digital converter 2 to measure period jitters and divided by n (1/n) 1 prior to time-to-digital converter 2 is used to enlarge the period jitters of a signal under test to enhance test precision. FIG. 1B is a detailed schematic view showing a conventional time-to-digital converter 2. The test resolution of the circuit shown in FIG. 1A is limited by the delay of the component in FIG. 1B. Thus, the resolution of the signal under test that is not divided by 1/n divider 1 is within limits.

FIG. 2 is a block diagram showing another conventional BIST circuit 20 for measuring period jitters comprising control signal generator 21, period to voltage converter 22 and ADC 23. Two output signals Q1 and Q2 are generated by control signal generator 21 according to a test signal T to control the charge time of comparator 26 from period to voltage 22. Charge pump 25 converts the charge time to voltage and stores the voltage in capacitor 24. Then, ADC 23 converts the load voltages to digital value. Output value of BIST 20 depends on resolution of ADC 23.

High precision period jitter of PLL is measured through the combination of BIST circuit 20 shown in FIG. 2 and high resolution ADC 23. Note that a defective ADC 23 may cause errors when measuring. Typically, using the ADC of current technologies is very difficult to detect the jitter less than 10 ps under the period of 1 ns~100 ns.

BRIEF SUMMARY OF INVENTION

A detailed description is given in the following embodiments with reference to the accompanying drawings.

The invention provides a BIST circuit for testing an ADC and a PLL, comprising a controllable delay circuit, a calculating logic and a charge-discharge circuit. The controllable delay circuit has a first input terminal for receiving a test signal and adjusting a delay of the test signal according to a first control signal and outputting a delay signal at a first output terminal. The calculating logic calculates a difference between a signal under test and the delay signal to generate a clock width which is further used to control the charge-discharge circuit and output a charge-discharge signal to the ADC to measure the clock width. Due to large clock width, the precision of the method described in FIG. 2 may be affected. The invention only measures the clock width of the difference between the signal under test and the delay signal to improve measuring precision. Further, the charge-discharge circuit can be applied to test the ADC and the PLL. The delay can be adjusted by using the controllable delay circuit to calibrate the measured results. As a result, the calibrated results are not be affected by process variation.

The invention further provides a method for measuring the static performances of an ADC, which consists of delaying the test signal to obtain a delay signal, wherein the delay signal has a predetermined delay compared with the test signal; obtaining a charge-discharge signal according to the test signal and the delay signal; inputting the charge-discharge signal to the ADC; adjusting a period of the test signal and the predetermined delay and obtaining different output codes at an output terminal of the analog-to-digital; obtaining code periods corresponding to each output code according to a probability of two adjacent output codes occurring in a predetermined number of samples times; obtaining code voltages corresponding to each output code according to the RC curve and its code period; and finally obtaining the DNL and the INL of the ADC.

In addition, the invention provides a period jitter measuring method for a test signal and an ADC comprising: delaying the test signal to obtain a delay signal, wherein the delay signal and the test signal having a predetermined delay; obtaining a charge-discharge signal according to the test signal and the delay signal; inputting the charge-discharge signal to the ADC and outputting different output codes at an output terminal of the ADC; obtaining code voltages corresponding to each output code; obtaining code period corresponding to each output code according to an RC curve and each code voltage; obtaining probabilities of each output code according to a number of times each output code occurs in a predetermined number of samples; and finally obtaining the period jitter of the clock signal under test.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
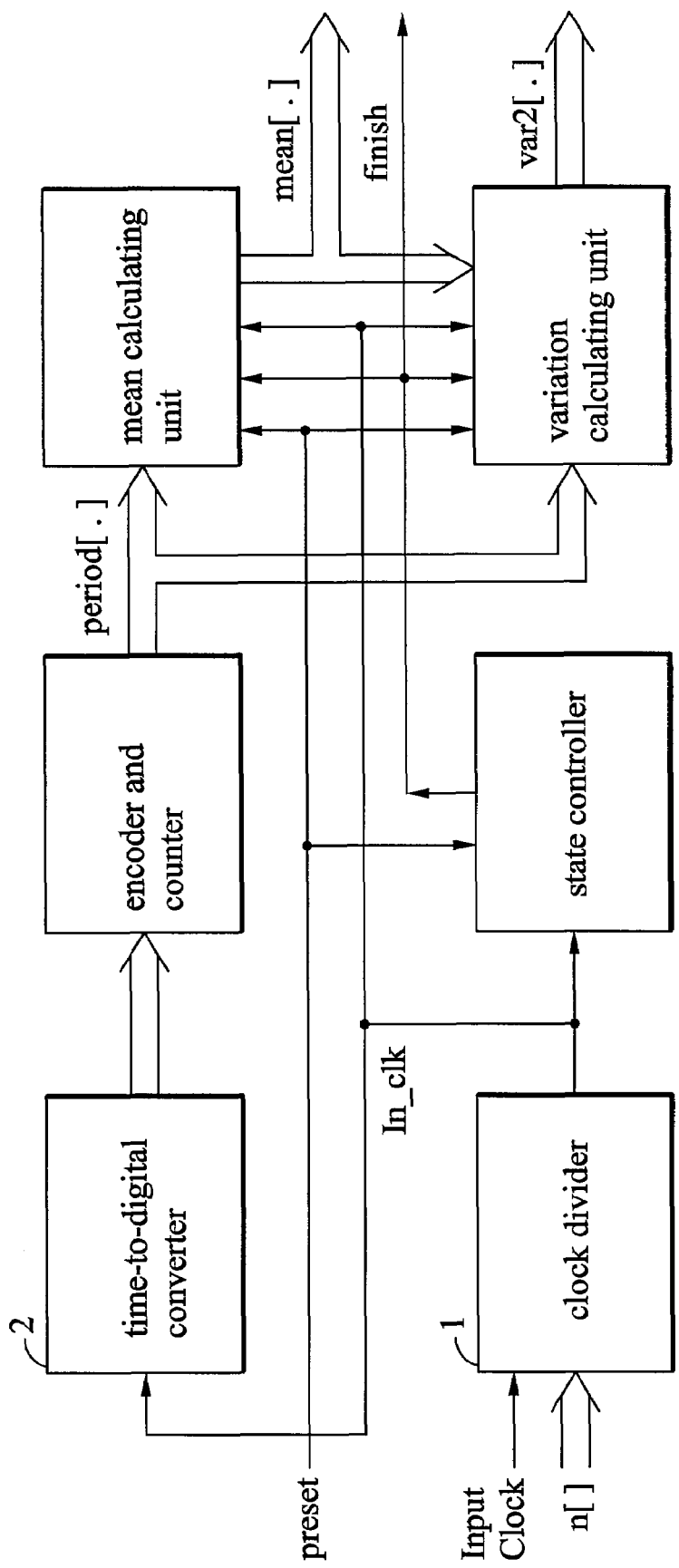
FIG. 1A is a schematic block diagram showing a conventional BIST circuit for measuring period jitters.
Figure 1B:
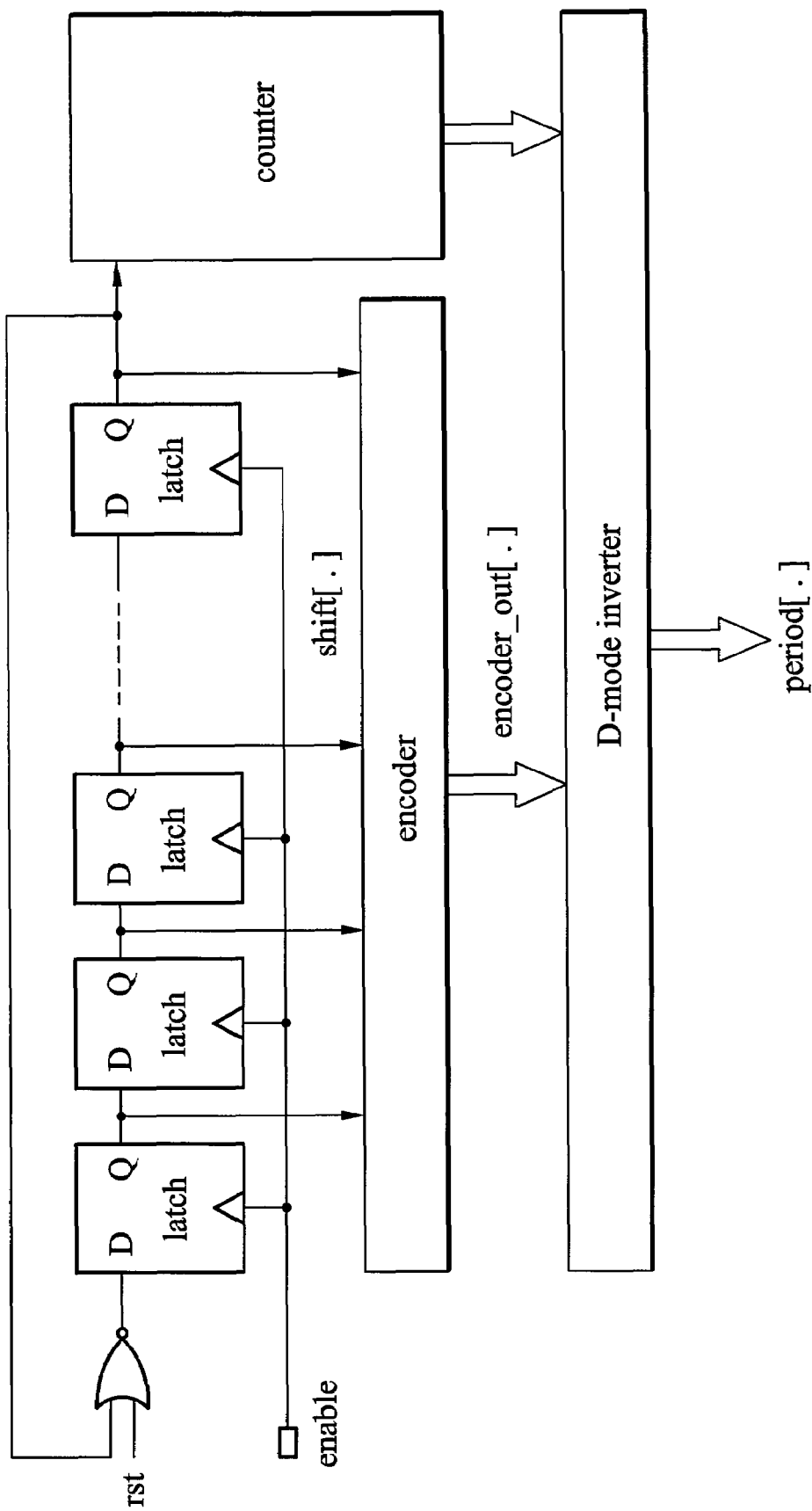
FIG. 1B is a schematic block diagram showing a time-to-digital circuit.
Figure 2:
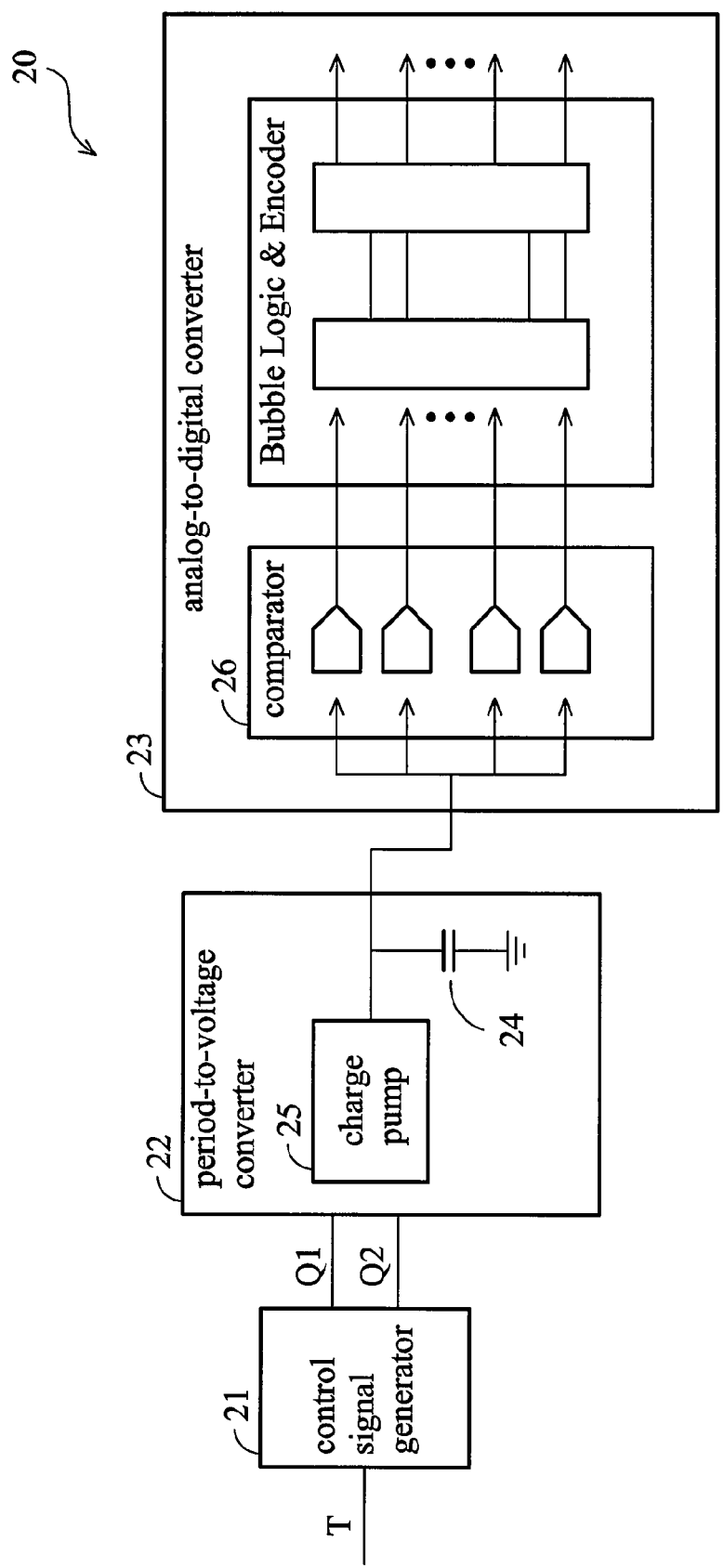
FIG. 2 is a schematic block diagram of a conventional BIST circuit for measuring period jitters.
Figure 3A:
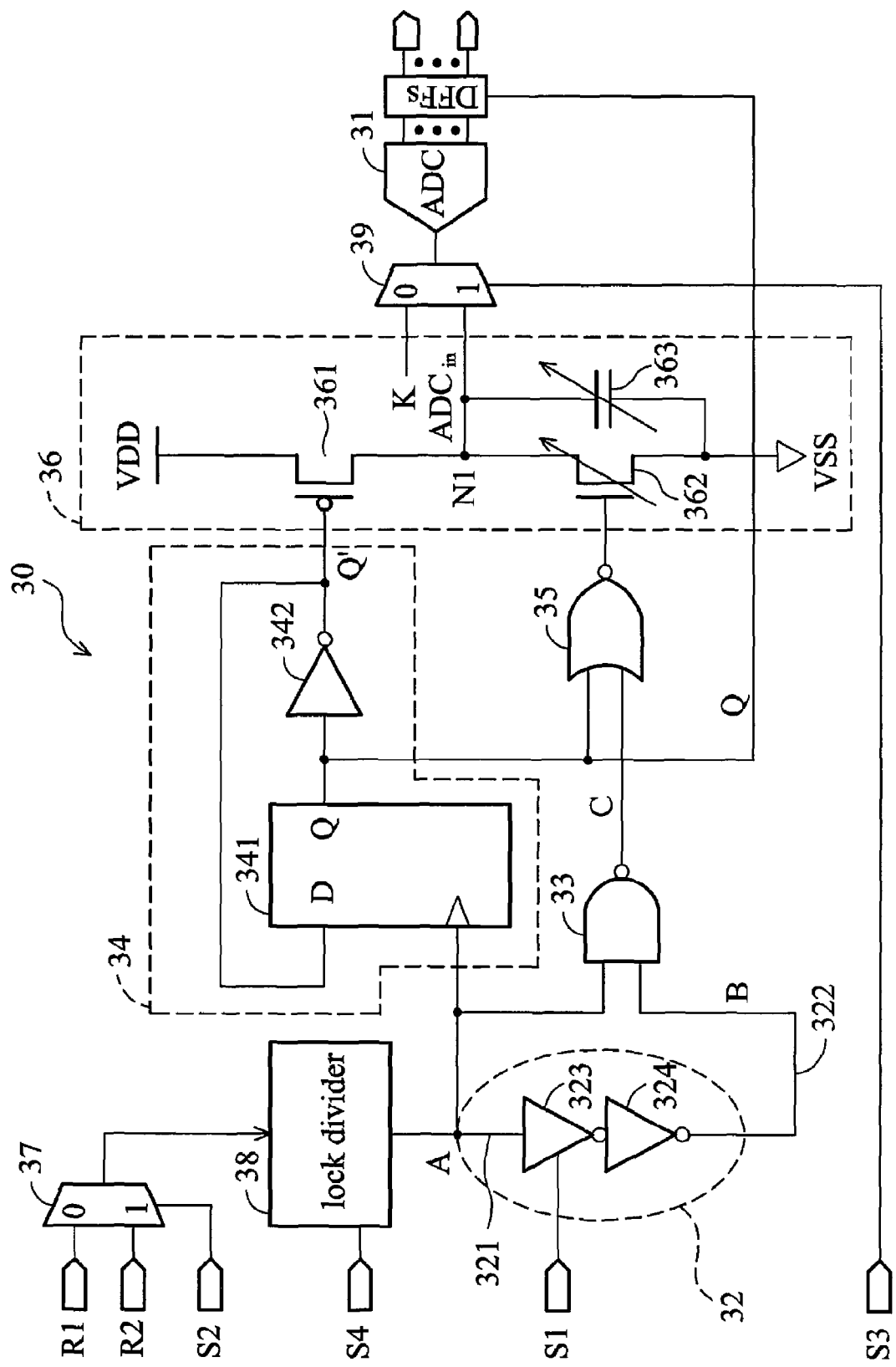
FIG. 3A is a block diagram showing a BIST circuit according to an embodiment of the invention.

FIG. 3A shows a BIST circuit 30, according to an embodiment of the invention, for testing performance of ADC 31 and period jitters of the phase lock loop. BIST circuit 30 comprises controllable delay circuit 32, NAND gate 33, dividing circuit 34, NOR gate 35 and charge-discharge circuit 36.

Controllable delay circuit 32 has a first input terminal for receiving a test signal A. The delay from test signal A to delay signal B is adjusted by controllable delay circuit 32 according to a first control signal SI which may be the digital bus, and delay signal B is output from a first output terminal 322. Test signal A and delay signal B are received by NAND gate 33 which performs NAND logic operation and outputs first logic signal C. Dividing circuit 34 is coupled to first input terminal 321 for increasing the period of test signal A and to output period-increased signal Q and inverse period-increased signal Q'. Period-increased signal Q and first logic signal C are received by NOR gate 35 which performs NOR logic operation and outputs second logic signal D. Charge-discharge circuit 36 outputs charge-discharge signal ADCin to ADC 31 according to inverse period-increased signal Q' and second logic signal D.

Two switched inverters 323 and 324 coupled in series shown in the FIG.3A are only the symbols of Controllable delay circuit 32, not the actual circuits. The function of Controllable delay circuit 32 can only be implemented by other circuits. Dividing circuit 34 comprises D-type flip-flop 341 and inverter 342. Inverse period-increased signal Q' and test signal A is received by D-type flip-flop 341 to output period-increased signal Q. Period-increased signal Q is received by inverter 342 coupled to D-type flip-flop 341 to output inverse period-increased signal Q'. Charge-discharge circuit 36 comprises PMOS 361, NMOS 362 and capacitor 363. PMOS 361 has a first gate to receive inverse period-increased signal Q', a first drain coupled to voltage source VDD, and a first source coupled to node N1. NMOS 362 has a second gate to receive second logic signal D, a second source coupled to node N1, a second drain coupled to ground VSS. Capacitor 363 is coupled between node N1 and ground VSS.

FIG. 3A shows BIST circuit 30 according to an embodiment of the invention comprises first multiplexer 37 and clock divider 38. First multiplexer 37 selectively outputs an ideal reference clock signal R1 of a PLL outputted signal R2 according to second control signal S2. Clock divider 38 divides the output signal of first multiplexer 37 according to divisor control signal S4 to generate test signal A. Thus the precision of the period jitter measurement can be enhanced. In this embodiment, first multiplexer 37 outputs ideal reference clock signal R1 when second control signal S2=0 (in digital-to-analog converter test mode), while first multiplexer 37 outputs PLL outputted signal R2 when second control signal S2=1 (in PLL test mode).

As shown in FIG. 3A, BIST circuit 30 according to the invention further comprises second multiplexer 39. Second multiplexer 39 selectively outputs a charge-discharge signal ADCin or output signal K of the standard circuit to ADC 31 according to third control signal S3. In this embodiment, second multiplexer 38 outputs charge-discharge signal ADCin when third control signal S3=0 (in standard mode), while second multiplexer 37 outputs output signal K of the standard circuit when third control signal S3=1 (in test mode).

Figure 3B:
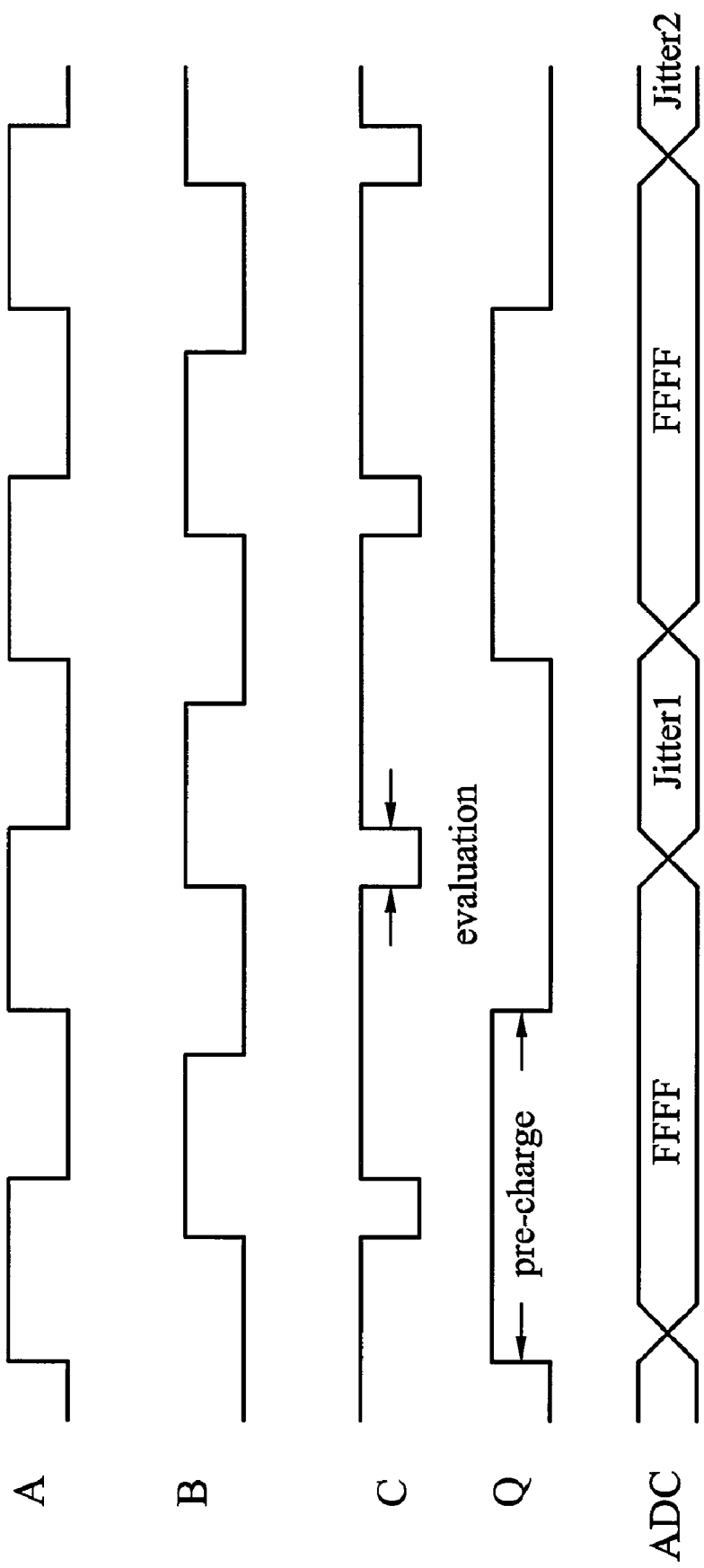
FIG. 3B is timing diagram showing the operating waveform of the BIST circuit according to an embodiment of the invention.

FIG. 3B shows wave forms of BIST circuit 30 according to an embodiment of the invention, wherein test signal A is an original clock signal under test, delay signal B is the signal output from controllable delay circuit 32 after the clock signal passes through. The invention takes advantage of the control of intra logic to generate clock signal C which is equal to a signal under-test subtracting a predetermined delay. The predetermined delay is equal to the delay of the controllable delay circuit. Dividing circuit 34 doubles the frequency of the original signal under test to pre-charge capacitor 363 in a half period and to evaluate the period jitters in another half period. The maximum value (assuming 16-bit, FFFF) of the ADC can be measured after pre-charging. Jitter 1 can be measured when first logic signal C discharges, Jitter 2 can be measured after second pre-charging, and so on.

Figure 4:
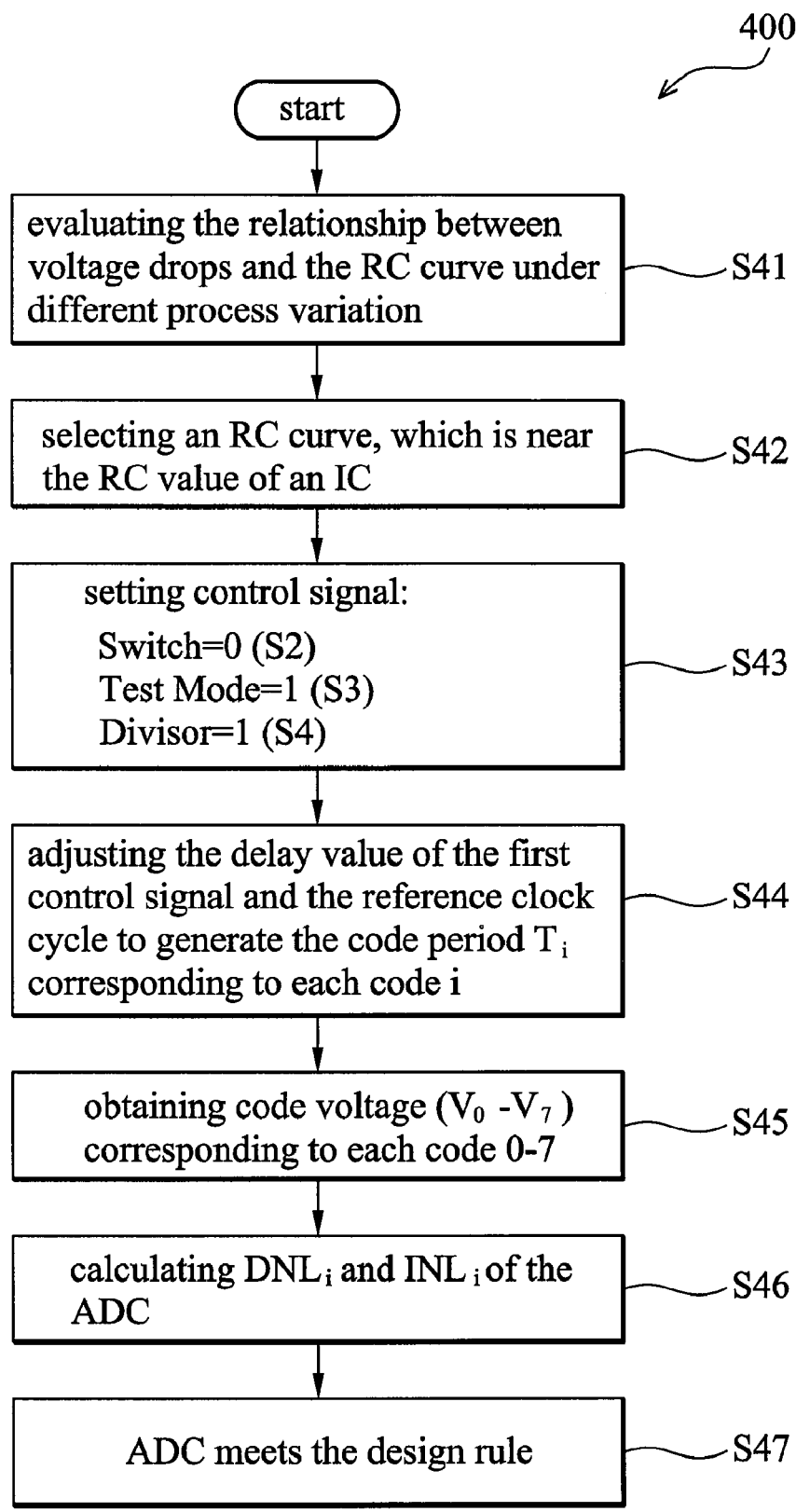
FIG. 4 shows the flowchart of testing the static characteristics of the ADC according to an embodiment of the invention.

FIG. 4 shows the flowchart 400 of testing the static characteristics of ADC 31 using BIST circuit 30. In this embodiment, ADC 31 is a 3-bit ADC.

Figure 5:
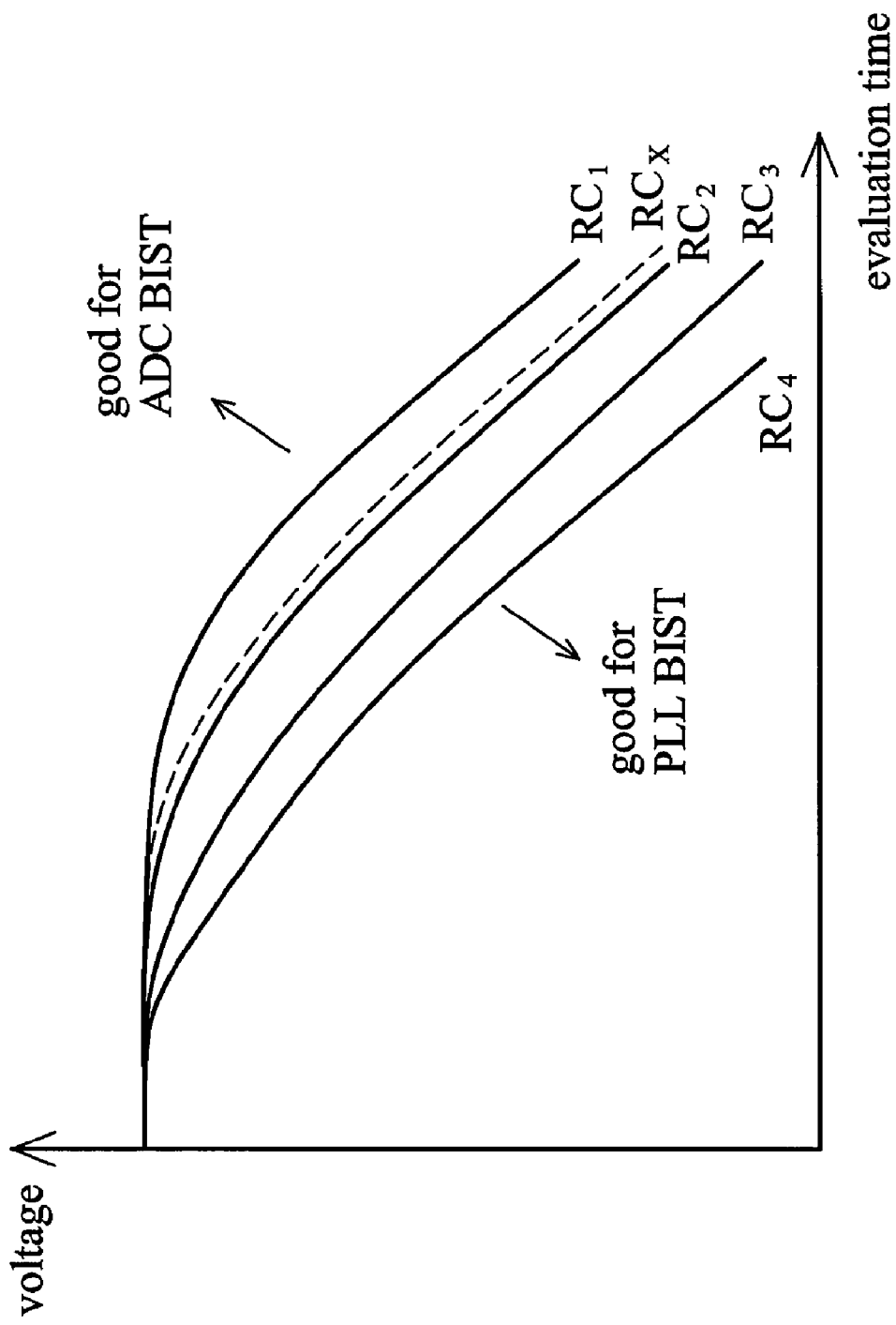
FIG. 5 is a schematic view showing the voltage drop and its corresponding RC curve under various process variations.

First, simulation of various voltage drops and corresponding RC curves (referring to FIG. 5) under various process variations according to the architecture of BIST circuit 30 is required before testing the static characteristic of ADC 31 (S41). Performing multipoint testing on an integrated circuit (IC) to obtain an RC value RCx, and selecting an RC curve in FIG. 5 closest to RCx (S42). In this embodiment, take curve RC2 for example. Note that process variation only affects the RC curve selected for each IC not the testing result.

Figure 6:
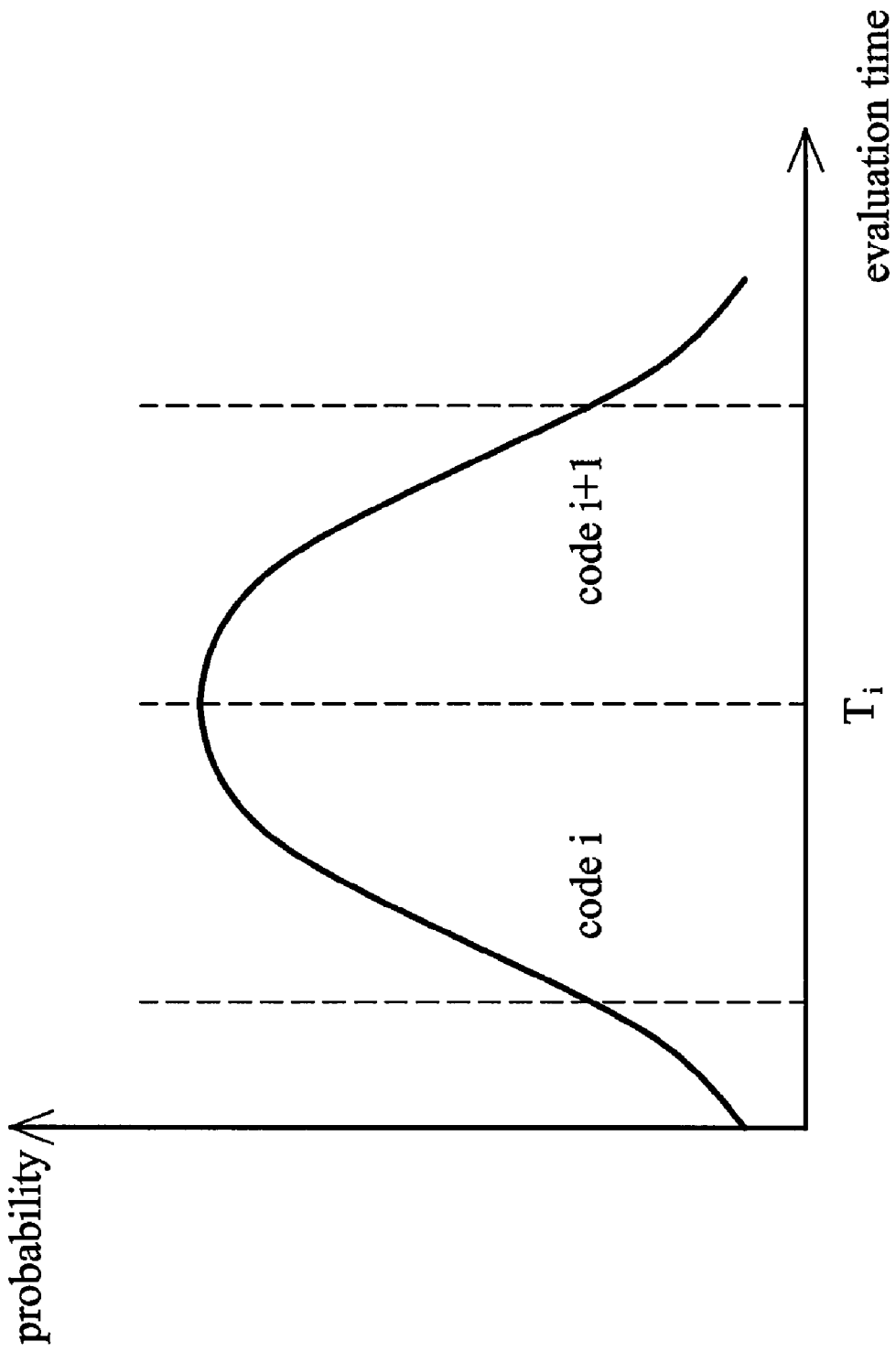
FIG. 6 shows the probability of adjacent output codes occurring in a predetermined number of samples.

Then, third control signal is set to S3=1, second control signal to S2=0 and divisor control signal to S4=1 (S43). Note that, divisor control signal S4 is only used to bypass ideal reference clock signal R1 to controllable delay circuit 32 in ADC mode. At this time, test signal A is ideal reference clock signal R1. Different output codes 0001~111 can be obtained at the output terminal of ADC 31 according to different periods of test signal A and first control signal S1. FIG. 6 shows each output code i and it's corresponding code period Ti obtained according to the probability of adjacent output codes i and i+1 occurring in a predetermined sampling times (S44). In this embodiment of the invention, test signal A is tested 100 times in a 10 ns period, code 2 occurs 10 times, code 3 occurs 40 times, code 4 occurs 40 times and code 5 occurs 10 times, such that code period T3 corresponding to code 3 is 10 ns. Code voltage V0~V7 corresponding to output code 000~111 is obtained according to code period T0~T7 and curve RC2 (S45). The static characteristics of INLi and DNLi can be generated according to code voltage Vi corresponding to output code i (S46). The performance of ADC is tradictionally defined as $$DNL_i = \frac{V_i - V_{i-1}}{LSB} - 1 \text{ and } INL_i = \sum_{k=0}^{i} DNL_k,$$

wherein LSB (least significant bit) is $$\frac{full\_voltage\_swing}{2^n}.$$

Figure 7:
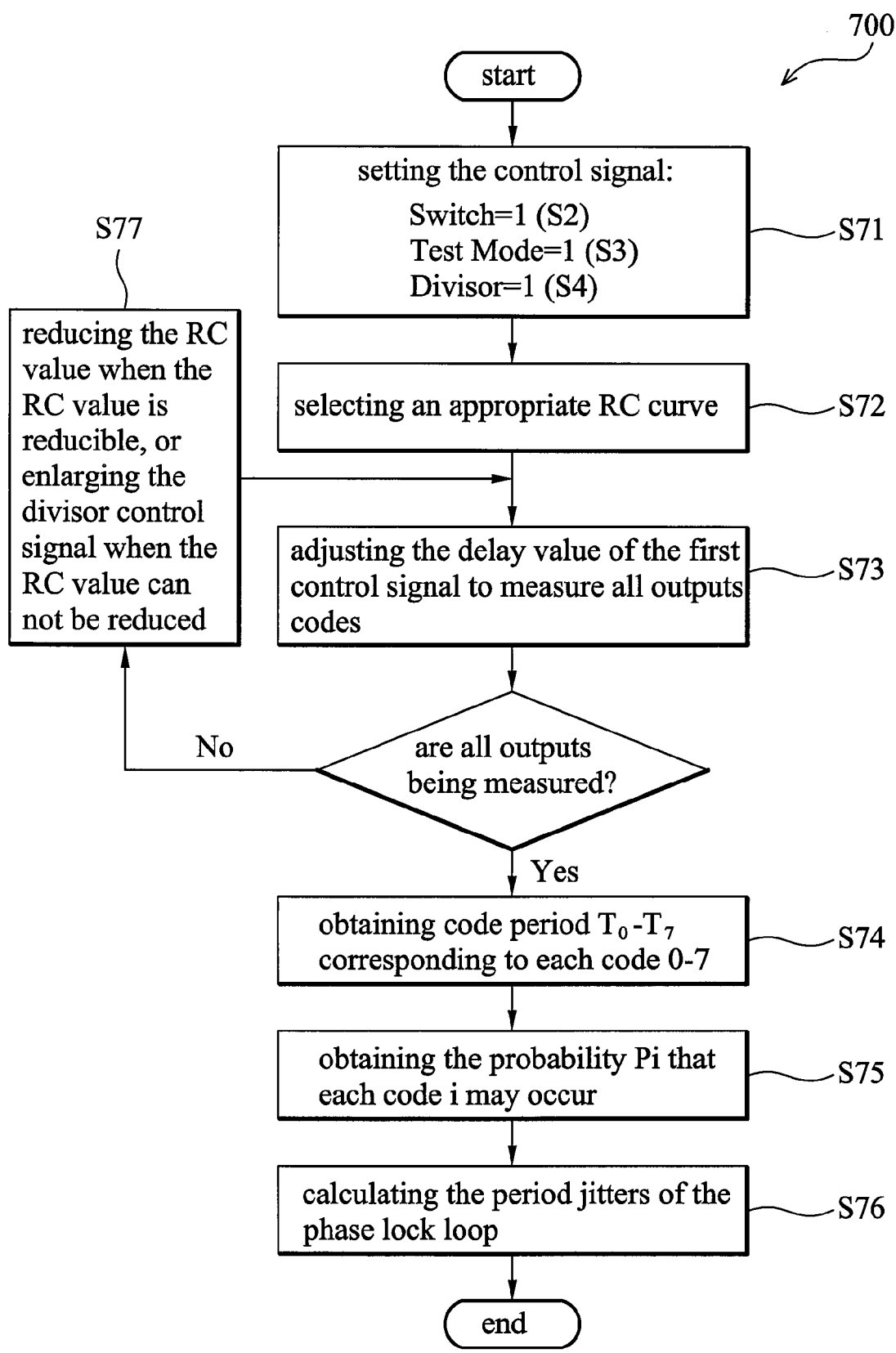
FIG. 7 shows the flowchart of testing the period jitters of the PLL according to an embodiment of the invention.

FIG. 7 shows the flowchart 700 of testing the period jitters of the clock signal from an oscillator or a PLL in an IC by BIST circuit 30. First, third control signal is set to S3=1, second control signal to S2=1 and divisor control signal to S4=1 (S71). Then, an RC curve is selected. Note that, RC2 is a multiple of the selected RC curve (S72). Note that, for high sensitivity, selecting the RC curve with an RC value less than a predetermined value is preferred when testing the period jitter of the PLL, such as selecting an RC curve with RC value=1/10*RC2, while electing the RC curve with an RC value exceeding another predetermined value is preferred when testing the static characteristics of ADC 31. In this embodiment, take curve RC3 for example. First control signal S1 is set according to the average value of first control signal S1 obtained from code period T0~T7 and test signal A (S73).

Another RC curve with smaller RC value than curve RC3 is selected when the output terminal of ADC 31 can not measure all output codes 0~7, until all output codes 0~7 are measured at the output terminal of ADC 31. If the RC value of an RC curve can not be reduced, the value of divisor control signal S4 is enlarged until all output codes 0~7 are measured at output terminal of ADC 31 (S77). Each code period T0~T7 corresponding to each code 0~7 can be obtained according to curve RC3 and each code voltage V0~V7 when all output codes 0~7 are measured at the output terminal of ADC 31 (S74).

The probability Pi of output code i can be obtained according to the number of times code i occurring in a predetermined number of samples (S75). The period jitter of the PLL can be obtained according to the period T of test signal A, each code period Ti corresponding to each output code i, and the probability Pi of each output code I (S76). The function to calculate period jitter is $$\sqrt{\sum_{i=0}^{n} P_i (T_i - T)^2}.$$

The purpose of the invention is to reduce the pulse width of test signal A to the second logic signal D, then to convert the pulse width of second logic signal D to voltage and to output the digital signal which is inversely proportional to the period of test signal A. A test signal A with a larger period results in larger pulse width of the second logic signal D, longer discharge time and smaller digital output value measured at the output terminal of ADC 31. Compared with the traditional method to measure the period of test signal A directly, the smaller pulse width of the second logic signal D can get higher resolution measurement results. The precision of the measuring method described in the invention can also be improved by using BIST circuit 30. Moreover, in the invention, both ADC and PLL can be tested accurately. The value of first control signal S1 can be adjusted by simulating the RC curves and by testing the characteristic curve of ADC 31. Therefore, the BIST circuit 30 can be used to calibrate the errors due to process variation to make the measurement results more accurate.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A BIST circuit for an ADC, comprising:
    a controllable delay circuit comprising a first input terminal for receiving a test signal, a delay of the test signal adjusted according to a first control signal, and an delay signal output from a first output terminal;
    a NAND gate receiving the test signal and the delay signal, and performing a NAND logic operation to generate a first logic signal;
    a dividing circuit coupled to the first output terminal for increasing a period of the test signal to output a period-increased signal and an inverse period-increased signal;
    a NOR gate receiving the period-increased signal and the first logic signal, and performing NOR logic operation to generate a second logic signal; and
    a charge-discharge circuit outputting a charge-discharge signal to the ADC according to the inverse period-increased signal and the second logic signal.

2. The BIST circuit as claimed in claim 1, further comprising a clock divider for dividing an output signal of a PLL according to a divisor control signal to generate the test signal.

3. The BIST circuit as claimed in claim 1, wherein the delay of the delay signal is adjusted by the controllable delay circuit through digital input method.

4. The BIST circuit as claimed in claim 3, wherein the controllable delay circuit comprises two inverters coupled in series.

5. The BIST circuit as claimed in claim 1, wherein the controllable delay circuit adjusts the measuring error caused by process variation.

6. The BIST circuit as claimed in claim 1, wherein the dividing circuit comprises:
    a D-type flip-flop for receiving the inverse period-increased signal and the test signal and outputting the period-increased signal; and
    an inverter coupled to the D-type flip-flop for receiving the period-increased signal and outputting the inverse period-increased signal.

7. The BIST circuit as claimed in claim 1, wherein the charge-discharge circuit comprises:
    a PMOS having a first gate for receiving the inverse period-increased signal, a first drain coupled to a voltage source, and a first source coupled to a node;
    an NMOS having a second gate for receiving the second logic signal, a second source coupled to the node, and a second drain coupled to a ground; and
    a capacitor coupled between the node and the ground.

8. A measuring method of an ADC for a test signal, comprising:
    delaying the test signal to obtain a delay signal, wherein the delay signal having a predetermined delay compared with the test signal;
    obtaining a charge-discharge signal according to the test signal and the delay signal;
    inputting the charge-discharge signal to the ADC;
    adjusting a period of the test signal and the predetermined delay and obtaining different output codes at an output terminal of the analog-to-digital;
    obtaining code periods corresponding to each output code according to a probability of two adjacent output codes occurred in a predetermined sampling times; and
    obtaining code voltages corresponding to each output code according to an RC curve and each code period;
    wherein a DNL error corresponding to each output code is generated according to the difference of the code voltages between two adjacent output codes.

9. The measuring method as claimed in claim 8, wherein the test signal is a clock signal during testing the ADC.

10. The measuring method as claimed in claim 8, wherein the code periods corresponding to each output code is determined by the percentage of occurrence of adjacent codes.

11. The measuring method as claimed in claim 8, wherein the RC curve is adjustable and comprises an RC value exceeding a predetermined value.

12. A period jitter measuring method for a test signal and an ADC, comprising:
- delaying the test signal to obtain a delay signal, wherein the delay signal and the test signal having a predetermined delay;
- obtaining a charge-discharge signal according to the test signal and the delay signal;
- inputting the charge-discharge signal to the ADC and outputting different output codes at an output terminal of the ADC;
- obtaining code voltages corresponding to each output code;
- obtaining code period corresponding to each output code according to an RC curve and each code voltage;
- obtaining probabilities of each output code according to a number of times each output code occurs in a predetermined number of samples; and
- obtaining a period jitter according to the probabilities of each output code and each code period.

13. The period jitter measuring method as claimed in claim 12, wherein the test signal is generated by dividing an output signal of a PLL by a divisor control signal.

14. The period jitter measuring method as claimed in claim 12, wherein the RC curve is adjustable and with an RC value less that a predetermined value.

15. The period jitter measuring method as claimed in claim 12, wherein the delay signal adjusts the measuring error caused by process variation.

\* \* \* \* \*